United States Patent
Suzuki

(10) Patent No.: US 11,421,307 B2
(45) Date of Patent: Aug. 23, 2022

(54) CEMENTED CARBIDE AND COATED CEMENTED CARBIDE, AND TOOL INCLUDING SAME

(71) Applicant: TUNGALOY CORPORATION, Fukushima (JP)

(72) Inventor: Harufumi Suzuki, Iwaki (JP)

(73) Assignee: TUNGALOY CORPORATION, Iwaki (JP)

(*) Notice: Subject to any disclaimer, the term of this patent is extended or adjusted under 35 U.S.C. 154(b) by 5 days.

(21) Appl. No.: 17/098,654

(22) Filed: Nov. 16, 2020

(65) Prior Publication Data

US 2021/0189529 A1   Jun. 24, 2021

(30) Foreign Application Priority Data

Dec. 19, 2019   (JP) .............................. JP2019-229587

(51) Int. Cl.
| | | |
|---|---|---|
| *C22C 29/08* | (2006.01) | |
| *B23B 27/14* | (2006.01) | |
| *C23C 14/06* | (2006.01) | |
| *C23C 14/32* | (2006.01) | |

(52) U.S. Cl.
CPC ............ *C22C 29/08* (2013.01); *B23B 27/148* (2013.01); *C23C 14/0617* (2013.01); *C23C 14/32* (2013.01); *B23B 2228/105* (2013.01)

(58) Field of Classification Search
CPC ........ C22C 29/08; B23B 27/14; B23B 27/148
USPC ......................................................... 428/698
See application file for complete search history.

(56) References Cited

U.S. PATENT DOCUMENTS

| | | | | |
|---|---|---|---|---|
| 2006/0051618 A1* | 3/2006 | Festeau | ................ | C23C 30/005 428/698 |
| 2008/0196318 A1* | 8/2008 | Bost | ...................... | C23C 30/005 51/295 |
| 2015/0376744 A1* | 12/2015 | Konyashin | ........... | C22C 29/067 51/309 |
| 2016/0008891 A1 | 1/2016 | Makino et al. | | |
| 2016/0177426 A1* | 6/2016 | Trivedi | .................. | C22C 29/04 428/457 |
| 2017/0057878 A1* | 3/2017 | Eso | ......................... | B24D 3/06 |
| 2019/0024221 A1* | 1/2019 | Toufar | .................. | C22C 29/067 |
| 2019/0119794 A1* | 4/2019 | Toufar | ................. | B22F 1/0011 |

FOREIGN PATENT DOCUMENTS

| | | |
|---|---|---|
| JP | 2004-059946 A | 2/2004 |
| JP | 2007-119888 A | 5/2007 |
| JP | 2014-223722 A | 12/2014 |
| KR | 10-1859644 B1 | 5/2018 |
| KR | 101951316     * | 6/2019 |

* cited by examiner

*Primary Examiner* — Archene A Turner
(74) *Attorney, Agent, or Firm* — Studebaker & Brackett PC

(57) ABSTRACT

Provided is a cemented carbide having superior wear resistance and fracture resistance. A cemented carbide containing 50.0 mass % or more and 94.5 mass % or less of tungsten carbide, 5.0 mass % or more and 12.0 mass % or less of Co, and 0.5 mass % or more and 4.0 mass % or less of Ru, the cemented carbide comprising a WC phase that includes tungsten carbide as a main component, and a binder phase that binds the WC phase, wherein the binder phase contains Co, the lattice constant of Co in the binder phase is 3.580 Å or more and 3.610 Å or less, and the saturation magnetization of the cemented carbide is 40% or more and 58% or less.

20 Claims, No Drawings

CEMENTED CARBIDE AND COATED CEMENTED CARBIDE, AND TOOL INCLUDING SAME

TECHNICAL FIELD

The present invention relates to a cemented carbide and a coated cemented carbide, and to a tool including same.

BACKGROUND ART

There are growing opportunities in terms of machining of difficult-to-cut materials such as titanium alloys used in aircraft parts and the like, and nickel-base heat-resistant alloys and cobalt-base heat-resistant alloys used for turbine blades in power generators. Cutting temperature is prone to be high in cutting of difficult-to-cut materials having low thermal conductivity, such as nickel-base heat-resistant alloys and cobalt-base heat-resistant alloys. In such high-temperature machining, the strength of the cutting edge of the cutting tool decreases, thereby giving rise to fracture, which results in a very short tool life as compared with that involved in the past machining of general steel. It is accordingly necessary to increase the high-temperature strength of the cutting tool, in order to achieve a longer cutting tool life even when cutting such difficult-to-cut materials.

Cutting tools that utilize a cemented carbide have been proposed in recent years to meet such requirements. For instance Japanese Patent Application Laid-open No. 2014-223722 discloses a cutting tool including a cemented carbide that contains mainly a WC phase, 11.5 to 12.5 mass % of Co, and 0.2 to 0.6 mass % of Cr on a $Cr_3C_2$ basis, wherein the average particle size of the WC phase is 0.85 to 1.05 μm, coercivity (Hc) is 13.0 to 16.0 kA/m, and saturation magnetization (Ms) is 165 to 200 kA/m. Japanese Patent Application Laid-open No. 2014-223722 indicates that such a cutting tool suppresses the occurrence of thermal cracking in the cutting edge, even in such machining where the cutting edge becomes hot as cutting of heat-resistant alloys, and has high wear resistance and fracture resistance.

Japanese Patent Application Laid-open No. 2004-059946 discloses an ultra fine-grained cemented carbide having a composition, in a ratio by weight, made up of Co and/or Ni: 5 to 12% and a total of 0.1 to 3% of two or more selected from among $Cr_3C_2$, VC, TaC, Ru and Si, and the balance WC and unavoidable impurities, wherein in a line analysis for Co on a polished surface by EPMA, with a beam diameter of 1 μm there is no Co peak exceeding 1.5 times an average intensity of a Co component in the line analysis per unit length of 100 μm, and wherein a value of saturation magnetization is 1.62 μTm$^3$/kg per 1% of Co, and coercivity is 27.8 to 51.7 kA/m. Japanese Patent Application Laid-open No. 2004-059946 indicates that such ultra fine-grained cemented carbide exhibits a long life up to fracture, and exhibits good wear resistance and high strength.

SUMMARY

Technical Problem

When cutting a difficult-to-cut material prone to result in work hardening, such as Inconel (registered trademark) or stainless steel, cracks occur readily at the cutting edge of the cutting tool on account of work hardening of the hard-to-cut material. Therefore, chipping and fracture are likely to occur in the cutting tool when cutting such difficult-to-cut materials. Furthermore, difficult-to-cut materials such as Inconel (registered trademark) and stainless steel have low thermal conductivity, and as a result wear of the cutting tool progresses readily. Also in a case where the difficult-to-cut material is milled, tool wear progresses readily and the tool is prone to break, on account of work hardening of the difficult-to-cut material.

In view of the above considerations, the inventors studied in detail cutting tools using conventional cemented carbides, such as those in Japanese Patent Application Laid-open No. 2014-223722 and Japanese Patent Application Laid-open No. 2004-059946, and found that the wear resistance and/or fracture resistance of the tools are still insufficient.

It is thus an object of the present invention, arrived at in view of the above problems, to provide a cemented carbide and a coated cemented carbide having superior wear resistance and fracture resistance, and to provide a tool including the foregoing.

Solution to Problem

As a result of diligent research aimed at solving the above problem, the inventors have found that superior fracture resistance and wear resistance can be achieved in a cemented carbide by controlling the contents of Co and Ru in the cemented carbide, the lattice constant of Co in a binder phase, and the saturation magnetization of the cemented carbide within predetermined ranges, and have accomplished the present invention on the basis of that finding. Further, the inventors have found that the life of a cutting tool using such a cemented carbide is longer than that of conventional tools, and have perfected the present invention on the basis of that finding.

Specifically, the present invention is as follows.

[1] A cemented carbide containing 50.0 mass % or more and 94.5 mass % or less of tungsten carbide, 5.0 mass % or more and 12.0 mass % or less of Co, and 0.5 mass % or more and 4.0 mass % or less of Ru,
the cemented carbide including a WC phase that includes tungsten carbide as a main component, and a binder phase that binds the WC phase,
wherein the binder phase contains Co, a lattice constant of Co in the binder phase is 3.580 Å or more and 3.610 Å or less, and
a saturation magnetization of the cemented carbide is 40% or more and 58% or less.

[2] The cemented carbide of [1], further including
a compound phase that contains at least one element selected from the group consisting of Ti, Zr, Hf, V, Nb, Ta, Cr and Mo, and at least one element selected from the group consisting of C, N, O and B,
wherein a total content of compounds that are contained in the compound phase is 5.0 mass % or less based on 100 mass % of the cemented carbide.

[3] The cemented carbide of [1] or [2], wherein an average particle size of tungsten carbide in the WC phase is 1.0 μm or more and 3.0 μm or less.

[4] The cemented carbide of any one of [1] to [3],
wherein the binder phase contains W, and
a content of W in the binder phase with respect to 100 atom % of a content of Co in the binder phase is 10.0 atom % or more and 20.0 atom % or less.

[5] A coated cemented carbide, including the cemented carbide of any one of [1] to [4], and a coating layer disposed on a surface of the cemented carbide.

[6] The coated cemented carbide of [5], wherein the coating layer contains at least one element selected from the group consisting of Ti, Zr, Hf, V, Nb, Ta, Cr, Mo, W, Al and Si, and at least one element selected from the group consisting of C, N, O and B.

[7] The coated cemented carbide of [5] or [6], wherein the coating layer is a single layer of a compound layer or has a multilayer having two or more compound layers which have different compositions from each other.

[8] The coated cemented carbide of any one of [5] to [7], wherein an average thickness of the coating layer is 1.0 μm or more and 20.0 μm or less.

[9] A tool, including the cemented carbide of any one of [1] to [4], or the coated cemented carbide of any one of [5] to [8].

Advantageous Effects of Invention

The present invention can provide a cemented carbide and a coated cemented carbide having superior wear resistance and fracture resistance, and in providing a tool including the foregoing.

DESCRIPTION OF EMBODIMENTS

Embodiments of the present invention (hereinafter referred to as "the present embodiment") will be explained in detail below, but the present invention is not limited thereto. Various modifications may be made to the present invention without departing from the gist of the invention.

Cemented Carbide

A cemented carbide of the present invention contains 50.0 mass % or more and 94.5 mass % or less of tungsten carbide, 5.0 mass % or more and 12.0 mass % or less of Co, and 0.5 mass % or more and 4.0 mass % or less of Ru, the cemented carbide including a WC phase that includes tungsten carbide as a main component, and a binder phase that binds the WC phase, wherein the binder phase contains Co, the lattice constant of Co in the binder phase is 3.580 Å or more and 3.610 Å or less, and the saturation magnetization of the cemented carbide is 40% or more and 58% or less.

By having the above features, the cemented carbide of the present embodiment exhibits improved wear resistance and fracture resistance, and as a result allows extending the tool life of a tool including the cemented carbide. Conceivable factors underlying the improvement of wear resistance and fracture resistance in the cemented carbide of the present embodiment include the following. However, such factors are not limited to those indicated below.

When in the cemented carbide of the present embodiment the content of tungsten carbide (WC) with respect to the entire cemented carbide is 50.0 mass % or more, the hardness of the cemented carbide increases, and as a result wear resistance improves. When the content of tungsten carbide with respect to the entire cemented carbide is 94.5 mass % or less, the content of Co with respect to the entire cemented carbide increases relatively, and the toughness of the cemented carbide improves, which results in improved fracture resistance.

When in the cemented carbide of the present embodiment the content of Co with respect to the entire cemented carbide is 5.0 mass % or more, the toughness of the cemented carbide increases, and as a result fracture resistance is improved and sinterability of the cemented carbide is improved, which results in improved fracture resistance. When the content of Co with respect to the entire cemented carbide is 12.0 mass % or less, the content of tungsten carbide with respect to the entire cemented carbide increases relatively, and the hardness of the cemented carbide improves, which results in improved wear resistance.

When in the cemented carbide of the present embodiment the content of Ru with respect to the entire cemented carbide is 0.5 mass % or more, solid solution strengthening occurs, which gives rise to increased strength of the cemented carbide. The fracture resistance of the cemented carbide is improved as a result. It is generally known that a brittle η phase ($Co_3W_3C$, $Co_6W_6C$) forms in a cemented carbide when the saturation magnetization of the cemented carbide is reduced. When the content of Ru with respect to the entire cemented carbide is 0.5 mass % or more, formation of the η phase in the cemented carbide can be suppressed, and hence the saturation magnetization of the cemented carbide can be made smaller than an ordinary one. As a result, the advantageous effect of solid solution strengthening can be rendered more enhanced than a conventional one. When the content of Ru with respect to the entire cemented carbide is 4.0 mass % or less, the sinterability of the cemented carbide is improved, which results in enhanced fracture resistance.

When the cemented carbide of the present embodiment includes a WC phase including tungsten carbide as a main component, the hardness of the cemented carbide increases, which results in enhanced wear resistance. When the cemented carbide of the present embodiment has a binder phase that binds the WC phase, the toughness of the cemented carbide increases, which results in enhanced fracture resistance.

When in the cemented carbide of the present embodiment the lattice constant of Co in the binder phase is 3.580 Å or more, solid solution strengthening occurs readily in the binder phase, and the hardness of the binder phase increases, which results in improved wear resistance of the cemented carbide. When the lattice constant of Co in the binder phase is 3.610 Å or less, excessive solid solution of W in the binder phase can be suppressed, and the fracture resistance of the cemented carbide is improved as a result.

When the saturation magnetization of the cemented carbide of the present embodiment is 40% or more, formation of the brittle n phase in the cemented carbide can be suppressed, and fracture resistance is improved as a result. When the saturation magnetization is 58% or less, W tends to be dissolved in the binder phase, and the hardness of the binder phase increases, which results in improved wear resistance of the cemented carbide.

WC Phase

The cemented carbide of the present embodiment includes a WC phase including tungsten carbide as a main component. The term "main component" denotes herein a component the content of which exceeds 50 mass % based on 100 mass % of the WC phase. From the viewpoint of improving wear resistance by increasing the hardness of the WC phase, the content of tungsten carbide with respect to the WC phase is preferably 70 mass % or more, and more preferably 85 mass % or more, based on 100 mass % of the WC phase. Yet more preferably, the content of tungsten carbide is 100 mass %, i.e. the WC phase consists of tungsten carbide. The upper limit of the content of tungsten carbide of the WC phase is not particularly restricted, and may be 100 mass %, or 95 mass %, or 90 mass %, based on 100 mass % of the WC phase.

The WC phase in the cemented carbide of the present embodiment may contain, besides tungsten carbide, an elemental metal, a carbide, a nitride or a carbonitride of at least one metal element selected from the group consisting of Ti, Zr, Hf, V, Nb, Ta, Cr, Co, Ru and Mo. Fracture resistance and plastic deformation resistance tend to be further improved, when the WC phase in the cemented carbide of the present embodiment contains, besides tungsten carbide, the above simple substance, carbide, nitride or carbonitride of those metal elements. From the same viewpoint, the WC phase may contain a simple substance or a carbide of at least one metal element selected from the group consisting of Ti, Ta, Zr, Co, Ru and Cr.

The average particle size of tungsten carbide of the WC phase in the cemented carbide of the present embodiment is preferably 1.0 µm or more and 3.0 µm or less. When the average particle size of tungsten carbide of the WC phase is 1.0 µm or more, the thermal conductivity of the cemented carbide increases, which tends to result in suppression of progressing wear. When the average particle size of tungsten carbide of the WC phase is 3.0 µm or less, the hardness of the cemented carbide is further improved, which tends to result in further improved wear resistance. From the same viewpoint, the average particle size of tungsten carbide of the WC phase is more preferably 1.2 µm or more and 3.0 µm or less.

The average particle size of tungsten carbide of the WC phase in the cemented carbide is measured for instance in accordance with the method below: The cemented carbide is polished in a direction perpendicular to the surface thereof, and an arbitrary cross-sectional structure of the cemented carbide exposed by polishing is observed as an SEM image obtained by magnifying that cross-sectional structure at 2000 to 5000 magnifications using a scanning electron microscope (SEM). Thereafter, a photograph of the above arbitrary cross-sectional structure is captured. Multiple straight lines are then randomly drawn on the obtained cross-sectional structure photograph, whereupon the particle sizes of all the tungsten carbide particles intersected by the straight lines are worked out by the Fullman equation (J. Metals, March 1953, 447).

Compound Phase

The cemented carbide of the present embodiment preferably includes a compound phase that contains at least one element selected from the group consisting of Ti, Zr, Hf, V, Nb, Ta, Cr and Mo, and at least one element selected from the group consisting of C, N, O and B, and more preferably includes a compound phase that consists of at least one element selected from the group consisting of Ti, Zr, Hf, V, Nb, Ta, Cr and Mo, and at least one element selected from the group consisting of C, N, O and B. When the cemented carbide of the present embodiment includes such a compound phase, the cemented carbide tends to be yet superior in wear resistance, and yet superior in plastic deformation resistance. From the same viewpoint, the compound phase yet more preferably consists of a carbide and/or nitride of at least one metal element selected from the group consisting of Ti, Zr, Ta and Cr, and particularly preferably consists of at least one selected from the group consisting of TiN, TiC, ZrC, TaC and $Cr_3C_2$. Herein very small amounts of Co, Ru and W may be dissolved in the compound phase.

Binder Phase

The cemented carbide of the present embodiment includes a binder phase that binds fractions of the WC phase together. The compound phase is not encompassed by the binder phase. The binder phase in the cemented carbide of the present embodiment contains Co, and preferably contains Co as a main component. The term "main component" denotes herein a component the content of which exceeds 50 mass % based on 100 mass % of the binder phase. The content of Co in the binder phase is more preferably 55 mass % or more, yet more preferably 60 mass % or more, and particularly preferably 65 mass % or more, based on 100 mass % of the binder phase. With the content of Co in the binder phase lying in the above range, the sinterability and toughness of the cemented carbide become further improved, which tends to result in further improved fracture resistance. The upper limit of the content of Co in the binder phase may be 90 mass %, or 85 mass %, or 80 mass %, based on 100 mass % of the binder phase.

The binder phase in the cemented carbide of the present embodiment preferably contains Ru. When the binder phase contains Ru, the strength of the binder phase is further improved and thus the fracture resistance of the cemented carbide tends to be further improved as a result. From the same viewpoint, the content of Ru relative to 100 atom % of the content of Co in the binder phase (Ru/Co) may be 3.0 atom % or more and 30.0 atom % or less, or 3.5 atom % or more and 25.0 atom % or less, or 5.0 atom % or more and 20.0 atom % or less.

Preferably, the binder phase in the cemented carbide of the present embodiment contains W. When the binder phase contains W, the hardness of the binder phase is further improved, which results in further improved wear resistance of the cemented carbide. The content of W relative to 100 atom % of the content of Co in the binder phase (W/Co) is preferably 10.0 atom % or more and 20.0 atom % or less. When W/Co is 10.0 atom % or more, the hardness of the binder phase becomes further improved, and as a result the wear resistance of the cemented carbide tends to be further improved. When W/Co is 20.0 atom % or less, the thermal conductivity of the cemented carbide is further improved, which as a result tends to result in suppression of progressing wear. From the same viewpoint, W/Co is more preferably 11.0 atom % or more and 19.0 atom % or less, and yet more preferably 12.0 atom % or more and 18.0 atom % or less.

The above ratios Ru/Co and W/Co in the present embodiment can be measured in accordance with the method described below in Examples.

When the lattice constant of Co in the binder phase in the cemented carbide of the present embodiment is 3.580 Å or more and 3.610 Å or less, solid solution strengthening occurs readily in the binder phase, and as a result the hardness of the binder phase increases, and the wear resistance of the cemented carbide increases. Further, it results in suppression of excessive dissolution of W in the binder phase, so that the fracture resistance of the cemented carbide is improved. From the same viewpoint, the lattice constant of Co is preferably 3.583 Å or more and 3.607 Å or less, more preferably 3.586 Å or more and 3.604 Å or less, and yet more preferably 3.590 Å or more and 3.600 Å or less.

The lattice constant of Co in the binder phase in the cemented carbide can be determined by using a commercially available X-ray diffractometer. For instance, lattice spacing can be measured by measuring X-ray diffraction with a 28/8 focusing optical system that utilizes Cu—Kα rays, under the following conditions, using an X-ray diffractometer (RINT TTRIII, by Rigaku Corporation). The measurement conditions include output: 50 kV and 250 mA; incidence-side Soller slit: 5°; divergence vertical slit: 2/3°; divergence vertical limit slit: 5 mm; scattering slit 2/3°; light-receiving-side Soller slit: 5°; light-receiving slit: 0.3 mm; BENT monochromator; light-receiving monochrome slit: 0.8 mm; sampling width: 0.01°, scan speed: 4°/min, and 2θ measurement range: 20° to 100°. The lattice spacing can be worked out from the obtained X-ray diffraction pattern where analysis software included with the X-ray diffraction device may be used. Using the analysis software, background processing or Kα2 peak removal is performed by cubic approximation, and profile fitting is carried out using a Pearson-VII function, to work out the lattice spacing. The lattice constant can be worked out on the basis of a relational expression (given below) between the obtained lattice spacing and the lattice constant.

Bragg equation: $2d=\lambda/\sin\theta$

In case of cubic crystal: $a^2=d^2\times(h^2+k^2+l^2)$

In case of hexagonal crystal: $a^2=d^2\times\{4/3\times(h^2+k^2+l^2)+l^2\times(c/a)^2\}$ Herein, d is the lattice spacing, λ is the wavelength of the tube used for measurement, θ is the incidence angle, a is the lattice constant, and h, k, and l are plane indices.

Composition of the Cemented Carbide

The content of tungsten carbide based on 100 mass % of the cemented carbide of the present embodiment is 50.0 mass % or more and 94.5 mass % or less, preferably 60.0 mass % or more and 94.0 mass % or less, more preferably 70.0 mass % or more and 93.0 mass % or less, and yet more preferably 80.0 mass % or more and 92.0 mass % or less. When the content of tungsten carbide based on 100 mass % of the cemented carbide lies in the above ranges, the hardness of the cemented carbide is further improved, and accordingly the wear resistance is further increased and the toughness of the cemented carbide is likewise further increased, which tends to result in further improved fracture resistance.

The content of Co based on 100 mass % of the cemented carbide of the present embodiment is 5.0 mass % or more and 12.0 mass % or less, preferably 6.0 mass % or more and 11.0 mass % or less, more preferably 7.0 mass % or more and 10.0 mass % or less, and yet more preferably 8.0 mass % or more and 10.0 mass % or less. When the content of Co based on 100 mass % of the cemented carbide lies in the above ranges, the toughness of the cemented carbide becomes further improved, and accordingly the fracture resistance is further improved and the sinterability of the cemented carbide is likewise further improved, which tends to result in further improved fracture resistance. Also the hardness of the cemented carbide is further improved, which results in improved wear resistance.

The content of Ru based on 100 mass % of the cemented carbide of the present embodiment is 0.5 mass % or more and 4.0 mass % or less, preferably 0.8 mass % or more and 3.8 mass % or less, more preferably 1.0 mass % or more and 3.5 mass % or less, and yet more preferably 1.5 mass % or more and 3.0 mass % or less. When the content of Ru based on 100 mass % of the cemented carbide lies in the above ranges, the strength of the cemented carbide becomes further improved, which results in further improved fracture resistance, and also the saturation magnetization of the cemented carbide can be made smaller than ordinary saturation magnetization, as a result of which the advantageous effect of solid solution strengthening can be rendered more enhanced than a conventional one. Also the sinterability of the cemented carbide is further improved, which tends to result in further improved fracture resistance.

The total content of the compounds that are contained in the compound phase in the cemented carbide of the present embodiment is preferably 5.0 mass % or less, more preferably 4.8 mass % or less, yet more preferably 4.5 mass % or less, and particularly preferably 3.0 mass % or less, based on 100 mass % of the cemented carbide. When the total content of the compounds that are contained in the compound phase based on 100 mass % of the cemented carbide lies within the above ranges, the content of tungsten carbide with respect to the entire cemented carbide increases relatively, and the hardness of the cemented carbide is further increased, as a result of which the wear resistance is further improved, and the toughness of the cemented carbide is likewise further increased, which results in further improved fracture resistance. Also the plastic deformation resistance of the cemented carbide is further improved. In a case where the cemented carbide has the compound phase, the lower limit of the total content of the compounds that are contained in the compound phase is not particularly restricted, and for instance the total content of the compounds that are contained in the compound phase may be more than 0.0 mass %, and may be 0.3 mass % or more, or 1.0 mass % or more, or 1.5 mass % or more, based on 100 mass % of the cemented carbide.

The proportions (mass %) and the compositions in the cemented carbide of the present embodiment are worked out as follows. A cross-sectional structure of the interior of the cemented carbide (for instance a cross-sectional structure at a position lying at a depth of 500 μm or more from the surface towards the interior) is observed, at least at three arbitrary sites, using a scanning electron microscope (SEM) with an energy dispersive X-ray spectrometer (EDS), and the respective compositions of the cemented carbide are measured by EDS. The respective proportion of each composition can be worked out on the basis of the obtained results. Specifically, the cemented carbide is polished in a direction perpendicular to the surface thereof, the above arbitrary cross-sectional structures exposed by polishing are observed by SEM, and the compositions and proportions (mass %) in the cemented carbide are worked out using the EDS included with the SEM. In further detail, the compositions and proportions can be obtained by observing the arbitrary cross-sectional structures in the cemented carbide at 2000 to 5000 magnifications, using by an SEM with an EDS, and by subjecting the cross-sectional structures to surface analysis. The proportions can be calculated by converting the obtained atom % of the respective compositions into mass % of the respective compositions. In the case for instance of WC, atom % for WC is obtained first, with atomic ratio of W:C=1:1, after which the proportion is calculated by converting atom % into mass %.

The cemented carbide of the present embodiment includes the above WC phase and binder phase, and may include the compound phase. The cemented carbide of the present embodiment may further include a phase different from the WC phase, the binder phase and the compound phase. The phase that is different from the WC phase, the binder phase and the compound phase is not particularly limited, and may be for instance a phase made up of metal elements that do not form a solid solution in any of the WC phase, the binder phase or the compound phase. From the viewpoint of providing the advantageous effect of the present invention in a more effective and reliable manner, preferably the cemented carbide of the present embodiment is made up of the WC phase and the binder phase, or is made up of the WC phase, the binder phase and the compound phase.

For instance the method below may be used in order to ascertain which specific phases the cemented carbide of the present embodiment includes. An arbitrary cross-sectional structure in the interior of the cemented carbide (for instance a cross-sectional structure at a position lying at a depth of 500 μm or more from the surface towards the interior), is observed at 2000 to 5000 magnifications using a scanning electron microscope (SEM) with an energy dispersive X-ray spectrometer (EDS), and the phase composition of that cross-sectional structure is checked on the SEM image. Thereafter, the composition of each phase deemed to be different from each other on the SEM image is measured by using the EDS. The specific phases present in the cross-sectional structure can be ascertained on the basis of the results. A phase having tungsten carbide as a main component is a WC phase. A phase made up of at least one element selected from the group consisting of Ti, Zr, Hf, V, Nb, Ta, Cr and Mo, and at least one element selected from the group consisting of C, N, O and B, is a compound phase. A phase that binds fractions of the WC phase together, and contains Co, is a binder phase. The phase that binds fractions of the WC phase together is, for instance, a so-called sea-phase in a case where the cemented carbide has a phase composition of sea-island structure in which the islands are the WC phase. In such a case, therefore, the WC phase is present discontinuously within the comparatively continuous binder phase. The above observation based on an SEM image and composition measurement by EDS are performed for at least three cross-sectional structures. The cemented carbide is deemed to consist of the WC phase, the binder phase and the compound phase, when no phase is observed except for the WC phase, the binder phase and the compound phase in all observations. Examples of phases different from the WC phase, the binder phase and the compound phase include for instance phases that include a phase deemed to be different from the WC phase, the binder phase and the compound phase on an SEM image, and being made up of simple substances of metal element that become present within the binder phase, through phase separation.

Saturation Magnetization

The saturation magnetization of the cemented carbide of the present embodiment is 40% or more and 58% or less, preferably 42% or more and 56% or less, more preferably 44% or more and 54% or less, and yet more preferably 46% or more and 52% or less. When the saturation magnetization of the cemented carbide lies within the above ranges, formation of a brittle q phase in the cemented carbide can be further suppressed, and accordingly fracture resistance is further improved, and W can readily be dissolved in the binder phase within the cemented carbide; as a result, the hardness of the cemented carbide further increases, and wear resistance is further improved.

Unless otherwise specified, the saturation magnetization of the cemented carbide is expressed as unit %. The saturation magnetization (%) of the cemented carbide in the present embodiment means a ratio of the saturation magnetization (emu) of the cemented carbide with respect to the theoretical saturation magnetization (emu) of Co contained in the cemented carbide. Specifically, the saturation magnetization (%) of the cemented carbide in the present embodiment is calculated on the basis of the formula below.

Saturation magnetization (%) of cemented carbide={saturation magnetization (emu) of cemented carbide}/[{theoretical saturation magnetization (emu/g) of Co}×{Co content (g) in cemented carbide}]

The saturation magnetization of the cemented carbide in the present embodiment can be measured using a known magnetic property measuring device. The magnetic property measuring device is not particularly limited, and examples include VSM (product name) by Toei Industry Co., Ltd. and MPMS3 (product name) by Quantum Design Japan, Inc. A known value can be used as the theoretical saturation magnetization of Co.

Coated Cemented Carbide

The coated cemented carbide of the present embodiment includes the above cemented carbide and a coating layer disposed on the surface of the cemented carbide. The wear resistance in such a coated cemented carbide is further improved through arrangement of the coating layer on the surface of the cemented carbide of the present embodiment. The coating layer may be a single layer of compound layer or may be a multilayer having two or more compound layers which have different compositions from each other.

The coating layer used in the present embodiment is not particularly limited, so long as it is used as a coating layer of a coated tool. Among such, the coating layer contains preferably at least one element selected from the group consisting of Ti, Zr, Hf, V, Nb, Ta, Cr, Mo, W, Al and Si, and at least one element selected from the group consisting of C, N, O and B. More preferably, the coating layer contains at least one element selected from the group consisting of Ti, Nb, Cr, Mo, W, Al and Si, and at least one element selected from the group consisting of C and N. Yet more preferably, the coating layer consists of at least one element selected from the group consisting of Ti, Zr, Hf, V, Nb, Ta, Cr, Mo, W, Al and Si, and at least one element selected from the group consisting of C, N, O and B. Even yet more preferably, the coating layer consists of at least one element selected from the group consisting of Ti, Nb, Cr, Mo, W, Al and Si, and at least one element selected from the group consisting of C and N. When the coating layer has the above features, the wear resistance and fracture resistance of the coated cemented carbide tends to be further improved. Specific examples of a compound layer in the coating layer are not particularly limited, and include for instance an α-type $Al_2O_3$ layer, a TiC layer, a TiN layer, a TiCN layer, a TiCNO layer, a TiCO layer, an $(Al_{0.6}Ti_{0.4})N$ layer, an $(Al_{0.5}Ti_{0.5})N$ layer, an $(Al_{0.67}Ti_{0.33})N$ layer, a $(Ti_{0.3}Si_{0.1})N$ layer, a $(Ti_{0.6}Al_{0.3}W_{0.1})N$ layer, a $(Ti_{0.3}Mo_{0.1})N$ layer, an $(Al_{0.7}Cr_{0.3})N$ layer, a NbN layer and an $(Al,Cr)_2O_3$ layer.

The average thickness of the compound layer in the coating layer used in the present embodiment is not particularly limited, so long as it lies in a range such that the advantageous effect of the present invention is not impaired. The average thickness of the compound layer may be, for instance, 1.0 μm or more and 5.0 μm or less for an α-type $Al_2O_3$ layer, 0.05 μm or more and 1.0 μm or less for a TiC layer and a TiN layer, 1.0 μm or more and 15.0 μm or less for a TiCN layer, 0.1 μm or more and 1.0 μm or less for a TiCNO layer and a TiCO layer, 0.1 μm or more and 5.0 μm or less for an $(Al_{0.6}Ti_{9.4})N$ layer, 0.03 μm or more and 5.0 μm or less for an $(Al_{0.5}Ti_{0.5})N$ layer, 0.03 μm or more and 5.0 μm or less for an $(Al_{0.67}Ti_{0.33})N$ layer, 1.0 μm or more and 3.0 μm or less for a $(Ti_{0.3}Si_{0.1})N$ layer, 2.0 μm or more and 4.0 μm or less for a $(Ti_{0.6}Al_{0.3}W_{0.1})N$ layer, 2.0 μm or more and 4.0 μm or less for a $(Ti_{0.3}Mo_{0.1})N$ layer, 0.1 μm or more and 3.0 μm or less for an $(Al_{0.7}Cr_{0.3})N$ layer, 0.1 μm or more and 1.0 μm or less for a NbN layer, and 0.1 μm or more and 1.0 μm or less for an $(Al,Cr)_2O_3$ layer. In a case where a compound layer having a given composition is present, in the coating layer, split into multiple layers, the term average thickness of the compound layer having the above composition signifies the total of the average thicknesses of all the compound layers having that composition. For instance, in a coating layer having a structure in which 100 layers each of an $(Al_{0.50}Ti_{0.50})N$ layer having an average thickness of 20 nm and an $(Al_{0.67}Ti_{0.33})N$ layer having an average thickness of 20 nm are laid up on each other alternately, then the average thicknesses of the $(Al_{0.50}Ti_{0.50})N$ layer and of the $(Al_{0.67}Ti_{0.33})N$ layer are each 2.0 μm.

The average thickness of the coating layer in the coated cemented carbide of the present embodiment is preferably 1.0 μm or more and 20.0 μm or less. When the average thickness of the coating layer is 1.0 µm or more, the wear resistance of the coated cemented carbide tends to be further improved, while when the average thickness of the coating layer is 20.0 µm or less, the fracture resistance of the coated cemented carbide tends to be further improved. From the same viewpoint, the average thickness of the coating layer is more preferably 2.0 µm or more and 15.0 µm or less, and yet more preferably 3.0 µm or more and 10.0 µm or less.

The thickness of the compound layer that makes up the coating layer used in the present embodiment, and the thickness of the entire coating layer, can be measured by using for instance an optical microscope, an SEM, or a transmission electron microscope (TEM), on the basis of the cross-sectional structure of the coated cemented carbide. The average thickness of each layer and the average thickness of the entire coating layer, in the coated cemented carbide of the present embodiment, can be worked out by measuring the thickness of each layer and the thickness of the entire coating layer, on the basis of cross sections at three or more sites, and then calculating the average value of the measured thicknesses.

The composition of each layer that makes up the coating layer in the coated cemented carbide of the present embodiment can be determined through measurement using for instance an EDS or a wavelength dispersive X-ray analyzer (WDS), on the basis of the cross-sectional structure of the coated cemented carbide.

Method for Producing a Cemented Carbide and a Coated Cemented Carbide

A method for producing the cemented carbide and the coated cemented carbide of the present embodiment will be explained by way of concrete examples as follows. The method for producing the cemented carbide and the coated cemented carbide of the present embodiment is not particularly limited so long as the configuration of the above cemented carbide can be achieved, and is not limited to the concrete examples set out below.

The method for producing the cemented carbide and the coated cemented carbide of the present embodiment may include for instance Steps (1) to (7) below.

Step (1): blending step wherein 50.0 mass % or more and 94.5 mass % or less of a tungsten carbide powder having an average particle size of 1.0 µm to 3.0 µm, 5.0 mass % or more and 12.0 mass % or less of a powder of Co having an average particle size of 0.5 µm to 3.0 µm, 0.5 mass % or more and 4.0 mass % or less of a powder of Ru having an average particle size of 0.5 µm to 3.0 µm, and as needed 5.0 mass % or less of a compound powder having an average particle size of 0.5 µm to 5.0 µm and made up of at least one element selected from the group consisting of Ti, Zr, Hf, V, Nb, Ta, Cr and Mo, and at least one element selected from the group consisting of C, N, O and B, are blended (the total of the foregoing starting powders is 100 mass %), to yield a blended powder.

Step (2): mixing step for obtaining a mixture by mixing and pulverizing the blended powder prepared in Step (1), together with a solvent, preferably for 8 hours to 40 hours, using a wet-type ball mill. The above solvent is not particularly limited, and examples thereof include for instance acetone, methanol, ethanol and isopropyl alcohol.

Step (3): drying step of evaporating the solvent of the mixture obtained in Step (2) by heating and drying the mixture at 100° C. or below, to obtain a dry mixture.

Step (4): molding step wherein paraffin wax is added to the dry mixture obtained in Step (3) in an amount of 1.0 mass % or more and 3.0 mass % or less based on 100 mass % of the dry mixture, and the whole mixture is shaped to a predetermined tool shape and molded by pressing at a pressure of 100 MPa or more and 500 MPa or less, to yield a molded body.

Step (5): temperature raising step of heating the molded body obtained in Step (4) under vacuum conditions of 70 Pa or less to a temperature preferably in the range of 1300° C. to 1600° C.

Step (6): sintering step of heating for 20 minutes or more and 60 minutes or less the molded body having undergone Step (5), at a constant temperature preferably of the above range of 1300° C. to 1600° C., in an atmosphere of an inert gas (for instance Ar) at 50 Pa or more and 1330 Pa or less.

Step (7): cooling step of cooling the molded body having undergone Step (6), from the above temperature in the range of 1300° C. to 1600° C. down to normal temperature, preferably at a rate of 10° C./min or more and 50° C./min or less, in an atmosphere of an inert gas (for instance Ar) at 10 kPa or more and 300 kPa or less.

The average particle size of the starting powder used in Step (1) is measured in accordance with the Fisher method (Fisher Sub-Sieve Sizer (FSSS)) set forth in American Society for Testing and Materials (ASTM) standard B330.

Steps (1) to (7) have the following purposes.

In Step (1) the composition of the cemented carbide can be controlled to lie within a predetermined range, by using a tungsten carbide powder, a Co powder, a Ru powder, and as needed a compound powder made up of at least one element selected from the group consisting of Ti, Zr, Hf, V, Nb, Ta, Cr and Mo, and at least one element selected from the group consisting of C, N, O and B, at a predetermined blending proportion. The saturation magnetization of the cemented carbide can be controlled to lie in a predetermined range by adjusting the carbon amount in the tungsten carbide (WC). Saturation magnetization tends to decrease when using a tungsten carbide powder having a low carbon amount. By adjusting the addition amount of Ru and the addition amount of the starting powders which each of W and Cr is derived from (tungsten carbide powder and $Cr_3C_2$ powder, sequentially) relative to the addition amount of Co, it becomes possible to control the content of Ru relative to 100 atom % of the content of Co in the binder phase (Ru/Co), the content of W relative to 100 atom % of the content of Co in the binder phase (W/Co), and the content of Cr relative to 100 atom % of the content of Co in the binder phase (Cr/Co). The lattice constant of Co in the binder phase tends to increase as Ru/Co increases. Saturation magnetization tends to decrease as W/Co increases. Saturation magnetization tends to decrease, and the average particle size of tungsten carbide of the WC phase tends to decrease, as Cr/Co increases.

In Step (2) the average particle size of tungsten carbide of the WC phase can be controlled. The longer the mixing time by the ball mill, the smaller the average particle size of tungsten carbide tends to be. In Step (2), a mixture can be obtained in which the starting powders prepared in Step (1) are mixed uniformly. From the viewpoint of setting the average particle size of tungsten carbide of the WC phase to lie in the range of 1.0 µm to 3.0 µm, the mixing time by the ball mill is preferably 8 hours or more and 40 hours or less, more preferably 10 hours or more and 38 hours or less, and yet more preferably 12 hours or more and 35 hours or less.

In Step (3) the mixture is heated and dried, as a result of which a dry mixture can be obtained from which the solvent has evaporated.

Step (4) enables molding to a predetermined tool shape, through addition of paraffin wax to the dry mixture. Moldability is improved through addition of a paraffin.

In Step (5), the molded body is heated in vacuum of 70 Pa or less. As a result, degassing prior to appearance of a liquid phase in the molded body and immediately following appearance of the liquid phase are promoted, and sinterability in the sintering step (Step (6)) is improved.

In Step (6) the molded body is sintered in an inert gas atmosphere, preferably at a temperature in the range of 1300° C. to 1600° C. As a result, the molded body is densified, and the mechanical strength of the molded body increases. The higher the sintering temperature, the larger the average particle size of tungsten carbide tends to be. The longer the sintering time, the larger the average particle size of tungsten carbide tends to be. The higher the sintering temperature, moreover, the greater tends to be the amount of element other than Co (for instance, Ru, W and Cr) that form a solid solution in Co in the binder phase. From the viewpoint of bringing the average particle size of tungsten carbide of the WC phase to lie in the range of 1.0 μm to 3.0 μm, and from the viewpoint of properly allow W and Ru dissolved in Co in the binder phase, the sintering temperature is preferably 1300° C. or more and 1600° C. or less, more preferably 1350° C. or more and 1600° C. or less, and yet more preferably 1400° C. or more and 1550° C. or less.

In Step (7) the molded body is preferably cooled at a rate of 10° C./min or more and 50° C./min or less from the above temperature in the range of 1300° C. to 1600° C. down to normal temperature, to yield thereby a cemented carbide. The higher the cooling rate, the larger the solid solution amount of W tends to be. In order to control the content of W relative to 100 atom % of the content of Co in the binder phase (W/Co) to lie in the appropriate range, the cooling rate is preferably 10° C./min or more and 50° C./min or less, more preferably 12° C./min or more and 48° C./min or less, and yet more preferably 15° C./min or more and 45° C./min or less.

The cemented carbide obtained as a result of the processes in Step (1) to Step (7) may be subjected as needed to grinding and/or to honing of a cutting edge. The cemented carbide of the present embodiment encompasses conceptually also cemented carbide having undergone such processing.

A method for producing the coated cemented carbide of the present embodiment will be explained by way of concrete examples as follows. The method for producing the coated cemented carbide of the present embodiment is not particularly limited so long as the features of the above coated cemented carbide can be achieved, and is not limited to the concrete examples set out below.

The coating layer of the coated cemented carbide of the present embodiment may be formed by chemical vapor deposition or may be formed by physical vapor deposition. Among them, the coating layer is preferably formed by physical vapor deposition. Examples of physical vapor deposition include for instance arc ion plating, ion plating, sputtering and ion mixing. Arc ion plating is preferred among the foregoing, since it affords yet superior adhesion between the cemented carbide and the coating layer.

Physical Vapor Deposition

The cemented carbide of the present embodiment having been worked to a tool shape is received in a reaction vessel of a physical vapor deposition apparatus, and the interior of the reaction vessel is evacuated to vacuum of $1 \times 10^{-2}$ Pa or less. After evacuation, the cemented carbide is heated until the temperature thereof is 200° C. or more and 800° C. or less, by a heater in the reaction vessel. After heating, Ar gas is introduced into the reaction vessel, to adjust pressure in the reaction vessel to 0.5 Pa or more and 5.0 Pa or less. The surface of the cemented carbide is then subjected to an ion bombardment treatment by Ar gas, through application of bias voltage in the range of −1000 V to −200 V to the cemented carbide and current in the range of 5 A to 60 A to a tungsten filament in the reaction vessel under an Ar gas atmosphere at a pressure of 0.5 Pa or more and 5.0 Pa or less. After the ion bombardment treatment of the surface of the cemented carbide, the interior of the reaction vessel is evacuated down to a vacuum pressure of $1 \times 10^{-2}$ Pa or less.

Next, the cemented carbide is heated until the temperature thereof gets to 200° C. or more and 600° C. or less. Thereafter, a reaction gas such as nitrogen gas is introduced into the reaction vessel, as needed together with Ar gas, and the pressure in the reaction vessel is adjusted to 0.5 Pa or more and 5.0 Pa or less. Then bias voltage in the range of −150 V to −10 V is applied to the cemented carbide, and a metal evaporation source according to the metal component of the coating layer is evaporated through arc discharge at 80 A or more and 150 A or less, to form the coating layer on the surface of the cemented carbide. A coated cemented carbide is obtained in that way.

Chemical Vapor Deposition

One, two or more type(s) of layer(s) selected from the group consisting of a TiC layer, a TiN layer, a TiCN layer, a TiCNO layer and a TiCO layer is (are) formed on the surface of the cemented carbide of the present embodiment having been worked to a tool shape. From the viewpoint of providing the advantageous effect of the present invention in a more effective and reliable manner, preferably a TiN layer and a TiCN layer are formed herein. Next, the surface of the formed layer may be oxidized (surface of the layer farthest from the cemented carbide, in the case of the layer that is formed is a plurality of layers). Thereafter, an uppermost layer selected from the group consisting of an α-type $Al_2O_3$ layer, a TiC layer, a TiN layer, a TiCN layer, a TiCNO layer and a TiCO layer may be further formed, as needed.

More specifically, a TiN layer can be formed by chemical vapor deposition, with a raw material gas composition of $TiCl_4$: 5.0 to 10.0 mol %, $N_2$: 20.0 to 60.0 mol % and $H_2$: balance, and with temperature set to 850° C. to 920° C., and pressure set to 100 hPa to 400 hPa.

A TiC layer can be formed by chemical vapor deposition, with a raw material gas composition of $TiCl_4$: 1.0 to 3.0 mol %, $CH_4$: 4.0 to 6.0 mol % and $H_2$: balance, and with temperature set to 990° C. to 1030° C., and pressure set to 50 hPa to 100 hPa.

A TiCN layer can be formed by chemical vapor deposition, with a raw material gas composition of $TiCl_4$: 5.0 to 7.0 mol %, $CH_3CN$: 0.5 to 1.5 mol % and $H_2$: balance and with temperature set to 840° C. to 890° C., and pressure set to 60 hPa to 80 hPa.

A TiCO layer can be formed by chemical vapor deposition, with a raw material gas composition of $TiCl_4$: 0.5 to 1.5 mol %, CO: 2.0 to 4.0 mol % and $H_2$: balance, and with temperature set to 975 to 1025° C., and pressure set to 60 hPa to 100 hPa.

A TiCNO layer can be formed by chemical vapor deposition, with a raw material gas composition of $TiCl_4$: 3.0 to 5.0 mol %, CO: 0.4 to 1.0 mol %, $N_2$: 30 to 40 mol % and $H_2$: balance, and with temperature set to 975° C. to 1025° C., and pressure set to 90 hPa to 110 hPa.

The surface of the layers that are formed in the above-mentioned way can be oxidized under conditions where the gas composition is set to CO: 0.1 to 1.0 mol % and $H_2$: balance, the temperature is set to 970° C. to 1020° C., and pressure is set to 50 hPa to 70 hPa. The oxidation time in this case is preferably 0.5 to 2 minutes.

In the present embodiment, the formed coating layer is preferably subjected to dry shot blasting. Preferably, the conditions of dry shot blasting include a shot pressure of 0.5 bar or more and 0.9 bar or less and a shot angle of 90°. In a case where in the blasting device used for dry shot blasting the shot material is jetted while nozzles move in a predetermined direction, the pitch interval of the nozzles in a direction perpendicular to the moving direction of the nozzles is preferably 3 mm to 5 mm. Further, the speed (moving speed) of the nozzles is preferably 6000 mm/min to 7000 mm/min. The average particle size of the shot material (medium) in dry shot blasting is preferably 120 μm to 400 μm (380 μm to 420 μm in a case where the material of the shot material is steel), more preferably 120 μm to 150 μm, and yet more preferably 120 μm to 140 μm. Further, the shot material (medium) in dry shot blasting is preferably one or more types of material selected from the group consisting of SiC, steel, $Al_2O_3$ and $ZrO_2$.

The cemented carbide and the coated cemented carbide of the present embodiment exhibit superior machining performance, particularly in machining of difficult-to-cut materials, and can be suitably used as a constituent material of tools. When used for instance as a constituent material of a cutting tool, the cemented carbide and the coated cemented carbide of the present embodiment deliver excellent performance in particular in cutting of difficult-to-cut materials. In a case where the cemented carbide and the coated cemented carbide of the present embodiment are used as the material of a tool (for instance a cutting tool) for machining a difficult-to-cut material of low thermal conductivity, the cemented carbide and the coated cemented carbide are particularly useful on account of their superior high-temperature strength and fracture resistance.

EXAMPLES

The present invention will be explained more specifically below by way of examples and comparative examples. The present invention is however not limited to the examples below.

Production of a Cemented Carbide

As starting powders there were prepared a tungsten carbide (WC) powder (having an average particle size of 4.2 μm only in Comparative sample 9, and an average particle size of 3.0 μm otherwise), a TiC powder having an average particle size of 1.5 μm, a TiN powder having an average particle size of 1.3 μm, a TaC powder having an average particle size of 1.0 μm, a ZrC powder having an average particle size of 3.0 μm, a $Cr_3C_2$ powder having an average particle size of 3.0 μm, a Co powder having an average particle size of 1.5 μm, and a Ru powder having an average particle size of 7.0 μm. Commercially available powders were used as these starting powders. As the powder of tungsten carbide (WC) of the starting material three types were prepared, A through C, having different carbon amounts as set forth in Table 1. Further, the average particle size of the starting powders was measured in accordance with the Fisher method (Fisher Sub-Sieve Sizer (FSSS)) set forth in American Society for Testing and Materials (ASTM) standard B330.

TABLE 1

| | WC starting powder | |
|---|---|---|
| Type | W (mass %) | C (mass %) |
| A | 93.97 | 6.03 |
| B | 93.87 | 6.13 |
| C | 93.77 | 6.23 |

Prepared starting materials were weighed for Invention samples 1 to 20 and Comparative samples 1 to 10 so that the compositions of the respective cemented carbides were those in Table 3 below. Each weighed starting powder was received and blended in a stainless steel pot, along with an acetone solvent and cemented carbide balls, followed by mixing and pulverization in a wet-type ball mill, for 6 hours to 48 hours as the ball mill time given in Table 2, to yield a mixture. The obtained mixture was heated at 80° C. to evaporate the acetone, and yield a dry mixture as a result. After addition of 1.5 mass % of paraffin wax to 100 mass % of the obtained dry mixture, press molding was performed at a pressure of 196 MPa using a predetermined mold, to obtain a molded product of the mixture. A mold such that the shape after sintering was insert shape SNGU1307 of the ISO standard, and a mold such that the shape after sintering was insert shape RPMT1204 of the ISO standard, were used herein as the mold.

The molded body of each mixture was placed in a sintering furnace, after which the temperature was raised from room temperature to a sintering temperature of 1400° C. to 1500° C. given in Table 2 below, in vacuum of 70 Pa or less. Thereafter, the molded body was sintered by being held at each sintering temperature for 50 minutes, in an argon gas atmosphere at 1000 Pa. After sintering, the molded body was cooled down to room temperature at a cooling rate of 10 to 50° C./min given in Table 2 below, in an argon atmosphere at 150 kPa.

Respective cemented carbides worked to a tool shape were thus produced as described above. Further, the cutting edge ridge of each obtained cemented carbide was honed with a SiC brush.

TABLE 2

| Sample number | WC starting powder | Ball mill time (hours) | Sintering temperature (° C.) | Cooling rate (° C./min) |
|---|---|---|---|---|
| Invention sample 1 | B | 12 | 1400 | 30 |
| Invention sample 2 | B | 12 | 1400 | 30 |
| Invention sample 3 | B | 12 | 1400 | 30 |
| Invention sample 4 | B | 12 | 1400 | 30 |
| Invention sample 5 | B | 16 | 1500 | 30 |
| Invention sample 6 | A + B (Mass ratio = 1:1) | 12 | 1400 | 30 |
| Invention sample 7 | B + C (Mass ratio = 1:1) | 12 | 1400 | 10 |

TABLE 2-continued

| Sample number | WC starting powder | Ball mill time (hours) | Sintering temperature (° C.) | Cooling rate (° C./min) |
|---|---|---|---|---|
| Invention sample 8 | B | 12 | 1400 | 30 |
| Invention sample 9 | B | 12 | 1400 | 30 |
| Invention sample 10 | B | 24 | 1400 | 30 |
| Invention sample 11 | B | 9 | 1450 | 30 |
| Invention sample 12 | B + C (Mass ratio = 1:1) | 12 | 1400 | 10 |
| Invention sample 13 | B | 12 | 1400 | 50 |
| Invention sample 14 | B | 12 | 1400 | 30 |
| Invention sample 15 | B | 12 | 1400 | 30 |
| Comparative sample 1 | B | 12 | 1400 | 30 |
| Comparative sample 2 | B | 12 | 1400 | 30 |
| Comparative sample 3 | B | 12 | 1400 | 30 |
| Comparative sample 4 | B + C (Mass ratio = 1:1) | 16 | 1500 | 30 |
| Comparative sample 5 | A | 12 | 1400 | 30 |
| Comparative sample 6 | C | 12 | 1400 | 10 |
| Comparative sample 7 | B | 12 | 1400 | 30 |
| Comparative sample 8 | B | 48 | 1400 | 30 |
| Comparative sample 9 | C | 6 | 1450 | 10 |
| Comparative sample 10 | B | 12 | 1400 | 30 |

Composition of the Cemented Carbide

The compositions and proportions (mass %) of the respective obtained cemented carbides were worked out as follows. The cross-sectional structure in the interior of each obtained cemented carbide (for instance cross-sectional structure at a position lying at a depth of 500 µm or more from the surface towards the interior) was observed, at least at three arbitrary sites, using a scanning electron microscope (SEM) with an energy dispersive X-ray spectrometer (EDS), and the composition of the cemented carbide was measured by EDS. The proportion of each composition in the respective cemented carbide was determined. Specifically, the cemented carbide was polished in a direction perpendicular to the surface thereof, the above arbitrary cross-sectional structures exposed by polishing were observed by SEM, and the composition and proportions (mass %) in the respective cemented carbide were worked out using the EDS included with the SEM. In further detail, the compositions and proportions were obtained by observing the arbitrary cross-sectional structures in the cemented carbide at 2000 to 5000 magnifications by SEM with EDS, and by subjecting the cross-sectional structures to surface analysis. The proportions were calculated by converting the obtained atom % of the respective compositions into mass % compositions. The results are given in Table 3.

The phase compositions of the cemented carbides were measured in the same way. The obtained cemented carbides consisted of a WC phase having tungsten carbide and a binder phase that binds the WC phase or consisted of a WC phase made up of tungsten carbide, a compound phase, and a binder phase. In all the cemented carbides the main component of the binder phase was Co, and the binder phase contained Ru and W.

TABLE 3

| | Composition of cemented carbide (mass %) | | | | | | | |
|---|---|---|---|---|---|---|---|---|
| Sample number | WC | TiC | TiN | TaC | ZrC | $Cr_3C_2$ | Co | Ru |
| Invention sample 1 | 88.8 | — | — | — | — | — | 9.0 | 2.2 |
| Invention sample 2 | 93.0 | — | — | — | — | — | 5.2 | 1.8 |
| Invention sample 3 | 86.3 | — | — | — | — | — | 11.9 | 1.8 |
| Invention sample 4 | 90.4 | — | — | — | — | — | 9.0 | 0.6 |
| Invention sample 5 | 87.3 | — | — | — | — | — | 9.0 | 3.7 |
| Invention sample 6 | 89.2 | — | — | — | — | — | 9.0 | 1.8 |
| Invention sample 7 | 89.2 | — | — | — | — | — | 9.0 | 1.8 |
| Invention sample 8 | 90.4 | — | — | — | — | — | 9.0 | 0.6 |
| Invention sample 9 | 89.2 | — | — | — | — | — | 9.0 | 1.8 |
| Invention sample 10 | 89.2 | — | — | — | — | — | 9.0 | 1.8 |
| Invention sample 11 | 89.2 | — | — | — | — | — | 9.0 | 1.8 |
| Invention sample 12 | 89.2 | — | — | — | — | — | 9.0 | 1.8 |
| Invention sample 13 | 89.2 | — | — | — | — | — | 9.0 | 1.8 |
| Invention sample 14 | 89.2 | — | — | — | — | 0.3 | 8.5 | 2.0 |
| Invention sample 15 | 83.4 | 1.5 | 1.5 | 1.5 | 0.1 | — | 10.0 | 2.0 |
| Comparative sample 1 | 93.5 | — | — | — | — | — | 4.7 | 1.8 |
| Comparative sample 2 | 85.6 | — | — | — | — | — | 12.6 | 1.8 |
| Comparative sample 3 | 90.7 | — | — | — | — | — | 9.0 | 0.3 |
| Comparative sample 4 | 86.5 | — | — | — | — | — | 9.0 | 4.5 |
| Comparative sample 5 | 89.2 | — | — | — | — | — | 9.0 | 1.8 |
| Comparative sample 6 | 89.2 | — | — | — | — | — | 9.0 | 1.8 |
| Comparative sample 7 | 88.5 | — | — | — | — | — | 9.0 | 2.5 |
| Comparative sample 8 | 90.7 | — | — | — | — | — | 9.0 | 0.3 |

TABLE 3-continued

| | Composition of cemented carbide (mass %) | | | | | | | |
|---|---|---|---|---|---|---|---|---|
| Sample number | WC | TiC | TiN | TaC | ZrC | Cr$_3$C$_2$ | Co | Ru |
| Comparative sample 9 | 89.2 | — | — | — | — | — | 9.0 | 1.8 |
| Comparative sample 10 | 91.0 | — | — | — | — | — | 9.0 | 0.0 |

Atomic Ratios in the Binder Phase

The content of W relative to 100 atom % of the content of Co in the binder phase (W/Co) was calculated as follows. Firstly, the cross-sectional structure in the obtained cemented carbide was observed with a TEM with EDS, at 20,000 to 50,000 magnifications. In a binder phase the ratio W/Co was measured by point analysis at three points. Similarly, W/Co was measured by performing point analysis for another binder phase (at three or more sites). The arithmetic average value of the measured W/Co (3 points×3 or more sites) was calculated. The content of Ru with respect to 100 atom % of the content of Co in the binder phase (Ru/Co) was calculated in the same manner as W/Co. Table 4 shows the calculated W/Co and Ru/Co.

Lattice Constant of Co in the Binder Phase

The lattice constant of Co in the binder phase was calculated as follows. X-ray diffraction with a 2θ/θ focusing optical system that utilized Cu—Kα rays was measured, under the following conditions, using an X-ray diffractometer (RINT TTRIII, by Rigaku Corporation). The measurement conditions included output: 50 kV and 250 mA; incidence-side Soller slit: 5°; divergence vertical slit: 2/3°; divergence vertical limit slit: 5 mm; scattering slit 2/3°; light-receiving-side Soller slit: 5°; light-receiving slit: 0.3 mm; BENT monochromator; light-receiving monochrome slit: 0.8 mm; sampling width: 0.01°, scan speed: 4°/min, and 2θ measurement range: 20 to 100°. Analysis software included with the X-ray diffractometer was utilized to determine the lattice spacing from the obtained X-ray diffraction pattern. Using the analysis software, background processing and Kα2 peak removal were performed by cubic approximation, and profile fitting was carried out using a Pearson-VII function, to work out the lattice spacing. The lattice constant was worked out on the basis of a relational expression (given below) between the obtained lattice spacing and the lattice constant. The calculation results are given in Table 4.

Bragg equation: $2d=\lambda/\sin\theta$

Relational expression between lattice spacing and lattice constant: $a^2=d^2\times(h^2+k^2+l^2)$ Herein, d is the lattice spacing, λ is the wavelength of the tube used for measurement, θ is the incidence angle, a is the lattice constant, and h, k, and l are plane indices.

Saturation Magnetization of the Cemented Carbide

The saturation magnetization of the cemented carbides were measured using a magnetic property measuring device. The measurement results are given in Table 4.

Average Particle Size of Tungsten Carbide of the WC Phase

The average particle size of tungsten carbide of the WC phase in the cemented carbide was calculated as follows. Firstly, the obtained cemented carbide was polished in a direction perpendicular to the surface thereof, and an arbitrary cross-sectional structure of the cemented carbide exposed by polishing and magnified at 2000 to 5000 magnifications using a scanning electron microscope (SEM), was observed on a backscattered electron image. Thereafter, a photograph of the above-mentioned arbitrary cross-sectional structure was taken, and multiple straight lines were randomly drawn on the obtained cross-sectional structure photograph. The particle sizes of all the tungsten carbide particles intersected by the straight lines were worked out by the Fullman equation (J. Metals, March 1953, 447). The above operation was performed at three or more sites, and the arithmetic mean value of the calculated average particle sizes of tungsten carbide was calculated in turn. The calculation results are given in Table 4.

TABLE 4

| Sample number | Cemented carbide Saturation magnetization (%) | WC phase Average grain size of tungsten carbide (μm) | Binder phase | | |
|---|---|---|---|---|---|
| | | | Lattice constant of Co (Å) | W/Co | Ru/Co |
| Invention sample 1 | 51 | 2.0 | 3.601 | 15.1 | 14.3 |
| Invention sample 2 | 53 | 2.0 | 3.601 | 16.4 | 20.2 |
| Invention sample 3 | 51 | 2.0 | 3.600 | 16.8 | 8.8 |
| Invention sample 4 | 47 | 2.1 | 3.589 | 14.5 | 3.9 |
| Invention sample 5 | 50 | 2.1 | 3.602 | 14.8 | 24.0 |
| Invention sample 6 | 41 | 1.8 | 3.605 | 17.5 | 11.7 |
| Invention sample 7 | 58 | 2.0 | 3.594 | 11.0 | 11.7 |
| Invention sample 8 | 57 | 2.1 | 3.581 | 15.2 | 3.9 |
| Invention sample 9 | 53 | 2.0 | 3.607 | 15.3 | 11.7 |
| Invention sample 10 | 51 | 1.2 | 3.601 | 15.1 | 11.7 |
| Invention sample 11 | 52 | 3.0 | 3.600 | 15.2 | 11.7 |
| Invention sample 12 | 57 | 1.9 | 3.600 | 10.8 | 11.7 |
| Invention sample 13 | 45 | 1.8 | 3.601 | 19.7 | 11.7 |
| Invention sample 14 | 44 | 1.2 | 3.599 | 15.2 | 13.7 |
| Invention sample 15 | 51 | 1.8 | 3.600 | 15.3 | 11.7 |
| Comparative sample 1 | 53 | 2.0 | 3.601 | 16.4 | 22.3 |

TABLE 4-continued

| Sample number | Cemented carbide Saturation magnetization (%) | WC phase Average grain size of tungsten carbide (μm) | Binder phase Lattice constant of Co (Å) | W/Co | Ru/Co |
|---|---|---|---|---|---|
| Comparative sample 2 | 51 | 2.0 | 3.600 | 16.8 | 8.3 |
| Comparative sample 3 | 54 | 2.1 | 3.571 | 14.5 | 1.9 |
| Comparative sample 4 | 58 | 2.1 | 3.605 | 14.8 | 29.2 |
| Comparative sample 5 | 37 | 1.8 | 3.605 | 17.5 | 11.7 |
| Comparative sample 6 | 62 | 2.0 | 3.594 | 13.2 | 11.7 |
| Comparative sample 7 | 46 | 2.0 | 3.616 | 15.3 | 16.2 |
| Comparative sample 8 | 44 | 0.3 | 3.601 | 15.1 | 1.9 |
| Comparative sample 9 | 64 | 4.2 | 3.592 | 13.1 | 11.7 |

Example 1

Invention samples 1 to 15 and Comparative samples 1 to 10 were subjected to Cutting test 1-1 and Cutting test 1-2 under the following conditions. The test results are given in Table 5.

Cutting Test 1-1
Insert: RPMT1204
Coating layer formed on the surface of the cemented carbide: coating layer A formed under condition A below
  Workpiece: Inconel (trademark) 625, cuboid shape
  Cutting speed: 40 m/min
  Feed: 0.30 mm/rev
  Depth of cut: 2.0 mm
  Coolant: used
  Evaluation item: the lapse of time of machinability within the tool life was measured taking tool life herein as the point in time where the sample was fractured, the coating peeled, or a maximum flank wear width reached 0.3 mm.

Cutting Test 1-2
Insert: SNGU1307
Coating layer formed on the surface of the cemented carbide: coating layer B formed under condition B below.
  Workpiece: SUS630, cuboid shape
  Cutting speed: 100 m/min
  Feed: 0.20 mm/rev
  Depth of cut: 2.0 mm
  Coolant: none
  Evaluation item: the lapse of time of machinability within the tool life was measured taking tool life herein as the point in time where the sample fractured, the coating peeled, or a maximum flank wear width reached 0.3 mm.

Coating layer A and Coating layer B formed on the surface of the cemented carbides were formed by physical vapor deposition illustrated below.

Firstly, each produced cemented carbide was attached to a holder in a reaction vessel of an arc ion plating apparatus. Metal evaporation source(s) whose composition was appropriately adjusted so as to obtain a predetermined coating layer composition, was set in the reaction vessel of the arc ion plating apparatus. The reaction vessel was sealed, and thereafter the pressure inside the reaction vessel was brought to vacuum of $1\times10^{-2}$ Pa or less. The cemented carbide was heated to 500° C. by a heater in a furnace. Once the temperature of the cemented carbide reached 500° C., Ar gas was introduced into the reaction vessel, until the pressure in the reaction vessel reached 5.0 Pa. A bias voltage of −500 V was applied to the cemented carbide in the reaction vessel, and a current of 50 A was caused to flow through a tungsten filament in the reaction vessel, to subject the surface of the cemented carbide to Ar ion bombardment treatment. Ion bombardment conditions were as follows.

Atmosphere in the reaction vessel: Ar atmosphere
  Pressure in the reaction vessel: 5.0 Pa After the Ar ion bombardment treatment, the Ar gas was discharged to bring the pressure in the reaction vessel to vacuum of $1\times10^{-2}$ Pa or less. Thereafter, a mixed gas of $N_2$ gas and Ar gas at a volume ratio of 1:1 was introduced into the reaction vessel while the temperature of the cemented carbide was maintained at 500° C., to bring about the mixed gas atmosphere at a pressure of 3.0 Pa in the interior of the reaction vessel. After heating of the cemented carbide, a bias voltage of −50 V was applied to the cemented carbide, and the metal evaporation source was evaporated by arc discharge of 150 A. A predetermined coating layer became formed as a result on the surface of the cemented carbide. The sample was cooled after formation of the coating layer. The sample was taken out from the reaction vessel after the sample temperature was decreased to 100° C. or below. Cutting tests were performed using the obtained sample. Formation conditions A and B of the coating layer were as follows.

Formation Condition A of the Coating Layer
Composition of metal evaporation source: composition from which $(Al_{0.50}Ti_{0.50})N$ and $(Al_{0.67}Ti_{0.33})N$ are obtained
Coating layer composition: alternate multilayer structure (stacking number of repeats: 100) of an $(Al_{0.50}Ti_{0.50})N$ layer (average thickness 20 nm) and an $(Al_{0.67}Ti_{0.33})N$ layer (average thickness 20 nm), in order of proximity to the cemented carbide
Average thickness of the coating layer: 4.0 μm Formation Condition B of the Coating Layer
Composition of metal evaporation source: composition from which $(Al_{0.50}Ti_{0.50})N$ and $(Al,Cr)_2O_3$ are obtained
Coating layer composition: multilayer structure of an $(Al_{0.50}Ti_{0.50})N$ layer (average thickness 4.0 μm), an $(Al,Cr)_2O_3$ layer (average thickness 0.5 μm) and an $(Al_{0.50}Ti_{0.50})N$ layer (average thickness 0.5 μm), in order of proximity to the cemented carbide
Average thickness of the coating layer: 5.0 μm The thickness of the coating layer was measured as follows. A cutting tool made up of the coated cemented carbide was mirror-polished in a direction perpendicular to the surface of the coated cemented carbide. An area in the surface (hereinafter referred to as a "mirror-polished surface") exposed as a result of the above mirror-polishing, the area near a position 50 μm away from the cutting edge of the surface facing the metal evaporation source toward the center of the surface was observed. The mirror-polished surface was observed using an optical microscope and an FE-SEM. The thickness of the coating layer was measured at three sites, on the basis of an observed image of the mirror-polished surface. The average value of the measured coating layer thicknesses was calculated. The composition of the coating layer was measured using an EDS included with the FE-SEM, and a WDS included with the FE-SEM.

TABLE 5

| Sample number | Cutting test 1-1 Machining time (min) | Cutting test 1-2 Machining time (min) |
|---|---|---|
| Invention sample 1 | 10 | 70 |
| Invention sample 2 | 5 | 30 |
| Invention sample 3 | 6 | 45 |
| Invention sample 4 | 5 | 30 |
| Invention sample 5 | 7 | 50 |
| Invention sample 6 | 8 | 55 |
| Invention sample 7 | 7 | 45 |
| Invention sample 8 | 5 | 35 |
| Invention sample 9 | 9 | 60 |
| Invention sample 10 | 6 | 45 |
| Invention sample 11 | 7 | 50 |
| Invention sample 12 | 5 | 35 |
| Invention sample 13 | 8 | 55 |
| Invention sample 14 | 7 | 50 |
| Invention sample 15 | 9 | 65 |
| Comparative sample 1 | 1 | 10 |
| Comparative sample 2 | 2 | 15 |
| Comparative sample 3 | 1 | 15 |
| Comparative sample 4 | 1 | 10 |
| Comparative sample 5 | 1 | 10 |
| Comparative sample 6 | 2 | 20 |
| Comparative sample 7 | 3 | 25 |
| Comparative sample 8 | 1 | 15 |
| Comparative sample 9 | 2 | 15 |
| Comparative sample 10 | 1 | 10 |

The results in Table 5 show that Invention samples 1 to 15 all involve a machining time of 5 minutes or more in Cutting test 1, which is longer than the machining time in Comparative samples 1 to 10, and exhibit better wear resistance and fracture resistance than Comparative samples 1 to 10. In Cutting test 2 as well, it is found that the machining time of each of Invention samples 1 to 15 is 30 minutes or more, which is longer than the machining time in Comparative samples 1 to 10, and exhibit better wear resistance and fracture resistance than Comparative samples 1 to 10.

Example 2

A cemented carbide was produced under the same conditions as Invention sample 1. Invention sample 16 was produced by forming a coating layer on the surface of the cemented carbide by physical vapor deposition illustrated below.

The surface of the cemented carbide was subjected to an Ar ion bombardment treatment under the same conditions as those of physical vapor deposition in Example 1. After the Ar ion bombardment treatment, the Ar gas was discharged to bring the pressure in the reaction vessel to vacuum of $1\times10^{-2}$ Pa or less.

Thereafter, a mixed gas of $N_2$ gas and Ar gas at a volume ratio of 1:1 was introduced into the reaction vessel while the temperature of the cemented carbide was maintained at 500° C., to bring about the mixed gas atmosphere at a pressure of 3.0 Pa in the interior of the reaction vessel. After heating of the cemented carbide, a TiN layer having a thickness of 0.2 µm was formed by evaporating a metal evaporation source by arc discharge of 120 A, while applying a bias voltage of −60 V to the cemented carbide.

After formation of the TiN layer, a mixed gas of $N_2$ gas, Ar gas and acetylene gas ($C_2H_2$) at a volume ratio of 45:40:15 was introduced into the reaction vessel while the temperature of the cemented carbide was maintained at 500° C., to bring about the mixed gas atmosphere at a pressure of 3.0 Pa in the interior of the reaction vessel. After heating of the cemented carbide, a TiCN layer having a thickness of 3.0 µm was formed, on the TiN layer, by evaporating a metal evaporation source by arc discharge of 120 A, while applying a bias voltage of −60 V to the cemented carbide. The sample was cooled after formation of the coating layers. The sample was taken out from the reaction vessel after the sample temperature dropped to 100° C. or below. The cutting tests were performed using the obtained sample.

Invention samples 17 to 20 were produced by forming a coating layer, by physical vapor deposition, on the surface of a cemented carbide prepared under the same conditions as those of the Invention sample 1. Coating layers (first layer and second layer, as well as a third layer as needed) were formed in accordance with the same method as that of the coating layer of Example 1, but herein the composition of metal evaporation sources and the vapor deposition time in the coating layer forming method of Invention samples 17 to 20 were adjusted so that the compositions of the coating layers shown in Table 6 were obtained. Table 6 shows the coating layer compositions of Invention samples 16 to 20.

TABLE 6

| | | Coating layer | | | |
|---|---|---|---|---|---|
| | | First layer | | Second layer | |
| Sample number | Cemented carbide | Composition | Thickness (µm) | Composition | Thickness (µm) |
| Invention sample 16 | Invention sample 1 | TiN | 0.2 | TiCN | 3.0 |
| Invention sample 17 | Invention sample 1 | $(Al_{0.6}Ti_{0.4})N$ | 0.5 | $(Ti_{0.9}Si_{0.1})N$ | 2.0 |
| Invention sample 18 | Invention sample 1 | $(Al_{0.6}Ti_{0.4})N$ | 0.5 | $(Ti_{0.6}Al_{0.3}W_{0.1})N$ | 3.0 |
| Invention sample 19 | Invention sample 1 | $(Al_{0.6}Ti_{0.4})N$ | 0.5 | $(Ti_{0.9}Mo_{0.1})N$ | 3.0 |
| Invention sample 20 | Invention sample 1 | $(Al_{0.6}Ti_{0.4})N$ | 0.5 | $(Ti_{0.6}Al_{0.3}W_{0.1})N$ | 2.5 |

TABLE 6-continued

| | | Coating layer | | |
| | | Third layer | | |
| Sample number | Cemented carbide | Composition | Thickness (μm) | Overall thickness (μm) |
| --- | --- | --- | --- | --- |
| Invention sample 16 | Invention sample 1 | | | 3.2 |
| Invention sample 17 | Invention sample 1 | (Al$_{0.7}$Cr$_{0.3}$)N | 0.5 | 3.0 |
| Invention sample 18 | Invention sample 1 | | | 3.5 |
| Invention sample 19 | Invention sample 1 | | | 3.5 |
| Invention sample 20 | Invention sample 1 | NbN | 0.2 | 3.2 |

Cutting test 2-1 and Cutting test 2-2 were performed on Invention samples 16 to 20 under the same conditions as those of Cutting test 1-1 and Cutting test 1-2, respectively, except for the changed coating layers. The test results are given in Table 7.

Cutting Test 2-1
Insert: RPMT1204
Coating layer formed on the surface of the cemented carbide: predetermined coating layer set out in Table 6.
Workpiece: Inconel (trademark) 625, cuboid shape
Cutting speed: 40 m/min
Feed: 0.30 mm/rev
Depth of cut: 2.0 mm
Coolant: used
Evaluation item: the lapse of time of machinability within the tool life was measured taking tool life herein as the point in time where the sample fractured, the coating peeled, or a maximum flank wear width reached 0.3 mm.

Cutting Test 2-2
Insert: SNGU1307
Coating layer formed on the surface of the cemented carbide: predetermined coating layer set out in Table 6.
Workpiece: SUS630, cuboid shape
Cutting speed: 100 m/min
Feed: 0.20 mm/rev
Depth of cut: 2.0 mm
Coolant: none
Evaluation item: the lapse of time of machinability within the tool life was measured taking tool life herein as the point in time where the sample fractured, the coating peeled, or a maximum flank wear width reached 0.3 mm.

TABLE 7

| Sample number | Cutting test 2-1 Machining time (min) | Cutting test 2-2 Machining time (min) |
| --- | --- | --- |
| Invention sample 16 | 6 | 35 |
| Invention sample 17 | 8 | 50 |
| Invention sample 18 | 5 | 40 |
| Invention sample 19 | 5 | 35 |
| Invention sample 20 | 6 | 40 |

The cemented carbide and coated cemented carbide of the present invention are superior in both wear resistance and fracture resistance. Therefore, the cemented carbide and coated cemented carbide of the present invention can be suitably used as a cutting tool, in particular for machining of difficult-to-cut materials, and is thus industrially applicable.

What is claimed is:

1. A cemented carbide containing 50.0 mass % or more and 94.5 mass % or less of tungsten carbide, 5.0 mass % or more and 12.0 mass % or less of Co, and 0.5 mass % or more and 4.0 mass % or less of Ru,
    the cemented carbide comprising a WC phase that includes tungsten carbide as a main component, and a binder phase that binds the WC phase,
    wherein the binder phase contains Co, a lattice constant of Co in the binder phase is 3.580 Å or more and 3.610 Å or less, and
    a saturation magnetization of the cemented carbide is 40% or more and 58% or less.

2. The cemented carbide of claim 1, further comprising a compound phase that contains at least one element selected from the group consisting of Ti, Zr, Hf, V, Nb, Ta, Cr and Mo, and at least one element selected from the group consisting of C, N, O and B,
    wherein a total content of compounds that are contained in the compound phase is 5.0 mass % or less based on 100 mass % of the cemented carbide.

3. The cemented carbide of claim 1, wherein an average particle size of tungsten carbide in the WC phase is 1.0 μm or more and 3.0 μm or less.

4. The cemented carbide of claim 1,
    wherein the binder phase contains W, and
    a content of W in the binder phase with respect to 100 atom % of a content of Co in the binder phase is 10.0 atom % or more and 20.0 atom % or less.

5. A coated cemented carbide, comprising:
    the cemented carbide of claim 1; and
    a coating layer disposed on a surface of the cemented carbide.

6. The coated cemented carbide of claim 5, wherein the coating layer contains at least one element selected from the group consisting of Ti, Zr, Hf, V, Nb, Ta, Cr, Mo, W, Al and Si, and at least one element selected from the group consisting of C, N, O and B.

7. The coated cemented carbide of claim 5, wherein the coating layer is a single layer of a compound layer or a multilayer having two or more compound layers which have different compositions from each other.

8. The coated cemented carbide of claim 5, wherein an average thickness of the coating layer is 1.0 μm or more and 20.0 μm or less.

9. A tool, comprising the cemented carbide of claim 1.

10. A tool, comprising the coated cemented carbide of claim 5.

11. The cemented carbide of claim 2, wherein an average particle size of tungsten carbide in the WC phase is 1.0 μm or more and 3.0 μm or less.

12. The cemented carbide of claim 2,
wherein the binder phase contains W, and
a content of W in the binder phase with respect to 100 atom % of a content of Co in the binder phase is 10.0 atom % or more and 20.0 atom % or less.

13. The cemented carbide of claim 3,
wherein the binder phase contains W, and
a content of W in the binder phase with respect to 100 atom % of a content of Co in the binder phase is 10.0 atom % or more and 20.0 atom % or less.

14. A coated cemented carbide, comprising:
the cemented carbide of claim 2; and
a coating layer disposed on a surface of the cemented carbide.

15. A coated cemented carbide, comprising:
the cemented carbide of claim 3; and
a coating layer disposed on a surface of the cemented carbide.

16. A coated cemented carbide, comprising:
the cemented carbide of claim 4; and
a coating layer disposed on a surface of the cemented carbide.

17. The coated cemented carbide of claim 15, wherein the coating layer contains at least one element selected from the group consisting of Ti, Zr, Hf, V, Nb, Ta, Cr, Mo, W, Al and Si, and at least one element selected from the group consisting of C, N, O and B.

18. The coated cemented carbide of claim 16, wherein the coating layer contains at least one element selected from the group consisting of Ti, Zr, Hf, V, Nb, Ta, Cr, Mo, W, Al and Si, and at least one element selected from the group consisting of C, N, O and B.

19. The coated cemented carbide of any one of claims 15, wherein an average thickness of the coating layer is 1.0 μm or more and 20.0 μm or less.

20. The coated cemented carbide of claim 16, wherein an average thickness of the coating layer is 1.0 μm or more and 20.0 μm or less.

* * * * *